US012615814B2

(12) United States Patent
Xu

(10) Patent No.: US 12,615,814 B2
(45) Date of Patent: Apr. 28, 2026

(54) TRANSISTOR AND METHOD FOR FABRICATING THE SAME

(71) Applicant: BEIJING HUA TAN YUAN XIN ELECTRONICS TECHNOLOGY CO., LTD., Beijing (CN)

(72) Inventor: Haitao Xu, Beijing (CN)

(73) Assignee: BEIJING HUA TAN YUAN XIN ELECTRONICS TECHNOLOGY CO., LTD. (CN)

( * ) Notice: Subject to any disclaimer, the term of this patent is extended or adjusted under 35 U.S.C. 154(b) by 666 days.

(21) Appl. No.: 18/043,313

(22) PCT Filed: Sep. 30, 2020

(86) PCT No.: PCT/CN2020/119486
§ 371 (c)(1),
(2) Date: Feb. 27, 2023

(87) PCT Pub. No.: WO2021/227345
PCT Pub. Date: Nov. 18, 2021

(65) Prior Publication Data
US 2023/0275125 A1     Aug. 31, 2023

(30) Foreign Application Priority Data

May 11, 2020    (CN) ........................ 202010393286.X

(51) Int. Cl.
*H01L 29/06*          (2006.01)
*H01L 29/423*         (2006.01)
(Continued)

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01)

(58) Field of Classification Search
CPC .... H10D 62/121; H10D 30/014; H10D 30/43; H10D 30/6735; H10D 30/6757;
(Continued)

(56) References Cited

U.S. PATENT DOCUMENTS 8,471,249 B2     6/2013  Chiu et al.
9,608,066 B1 *   3/2017  Ando ................... H10D 64/691
(Continued)

FOREIGN PATENT DOCUMENTS

CN      103518255 A     1/2014
CN      105390497 A     3/2016
(Continued)

OTHER PUBLICATIONS

International Search mailed Feb. 18, 2021, directed to International Patent Application No. PCT/CN2020/119486, 3 pages.
(Continued)

*Primary Examiner* — Tong-Ho Kim
(74) *Attorney, Agent, or Firm* — Emerson, Thomson & Bennett, LLC; Roger D. Emerson; Peter R. Detorre

(57) ABSTRACT

A transistor and a fabrication method thereof are provided. The transistor includes a substrate, a low-dimensional material layer, a gate, a source, a drain, a gate dielectric layer, and spacers. The low-dimensional material layer is provided above the substrate. The source is located at a first side of the gate. The drain is located at a second side of the gate. The gate dielectric layer is provided between the gate and the low-dimensional material layer. The spacers are provided between the source and the gate and between the drain and the gate, respectively, and have fixed charges. In the transistor, the fixed charges in the spacers are used to electrostatically dope the channel material in the spacer region.

14 Claims, 7 Drawing Sheets

(51) Int. Cl.

| | |
|---|---|
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |

(58) Field of Classification Search
CPC .... H10D 62/80; H10D 62/118; H10D 62/117; H10D 30/60; H10D 62/235; H10D 64/018; H10D 64/511; H10K 10/484; H10K 85/221; B82Y 10/00
USPC ........................................................ 257/288
See application file for complete search history.

(56) References Cited

U.S. PATENT DOCUMENTS

| | | | | |
|---|---|---|---|---|
| 2011/0133169 A1* | 6/2011 | Bangsaruntip | ..... | H10D 30/6757 257/E29.255 |
| 2012/0286244 A1* | 11/2012 | Chiu | ...................... | B82Y 10/00 257/E51.04 |
| 2014/0151765 A1* | 6/2014 | Franklin | ................ | B82Y 10/00 257/288 |
| 2014/0264276 A1* | 9/2014 | Chang | ................ | H10D 30/6757 438/300 |
| 2015/0144884 A1* | 5/2015 | Yamaguchi | ............ | H10D 30/01 257/29 |
| 2015/0287942 A1* | 10/2015 | Cao | ...................... | H10K 10/472 438/151 |

FOREIGN PATENT DOCUMENTS

| | | |
|---|---|---|
| CN | 110534563 A | 12/2019 |
| JP | 2010283209 A | 12/2010 |

OTHER PUBLICATIONS

Written Opinion of the International Searching Authority mailed Feb. 18, 2021, directed to International Patent Application No. PCT/CN2020/119486, 3 pages.

International Preliminary Report on Patentability issued Nov. 15, 2022, directed to International Patent Application No. PCT/CN2020/119486, 4 pages.

International Preliminary Report on Patentability directed to the related International Patent Application No. PCT/CN2020/119486, mailed on Nov. 15, 2022, 4 pages.

* cited by examiner

| | |
|---|---|
| forming a low-dimensional material layer, a gate dielectric layer, a source, a drain and a gate above a substrate | S701 |
| forming spacers between the source and the gate and between the drain and the gate, respectively | S702 |

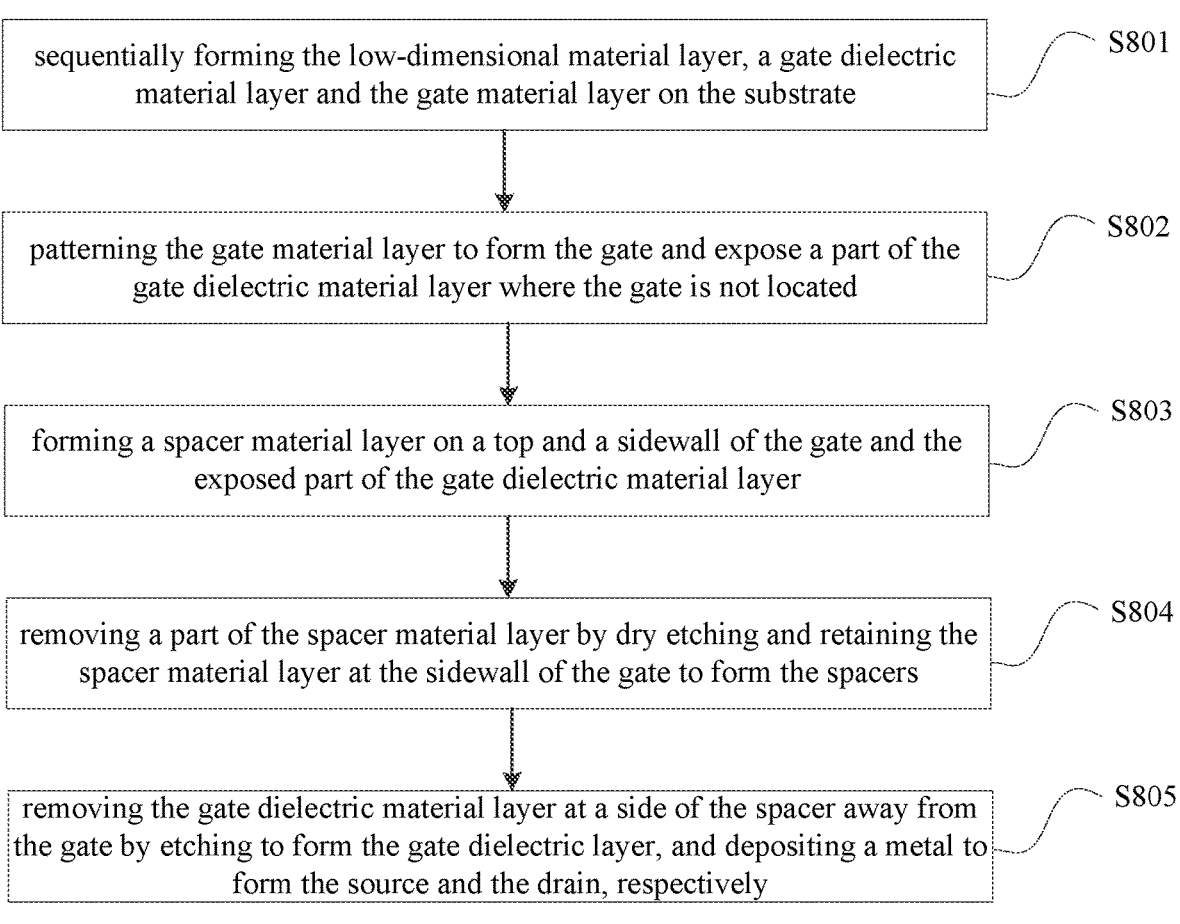

| sequentially forming the low-dimensional material layer, a gate dielectric material layer and the gate material layer on the substrate | S801 |

| patterning the gate material layer to form the gate and expose a part of the gate dielectric material layer where the gate is not located | S802 |

| forming a spacer material layer on a top and a sidewall of the gate and the exposed part of the gate dielectric material layer | S803 |

| removing a part of the spacer material layer by dry etching and retaining the spacer material layer at the sidewall of the gate to form the spacers | S804 |

| removing the gate dielectric material layer at a side of the spacer away from the gate by etching to form the gate dielectric layer, and depositing a metal to form the source and the drain, respectively | S805 |

Fig. 8

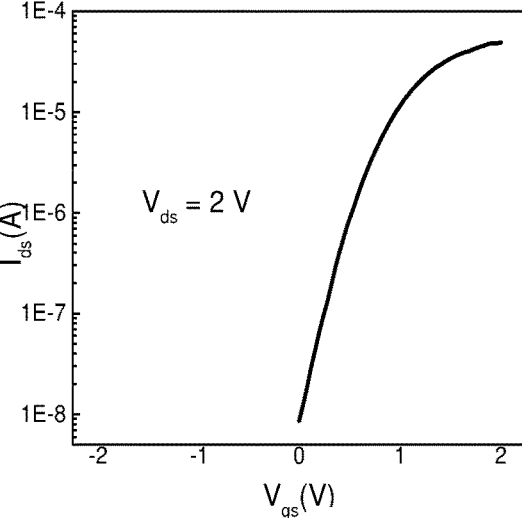

TRANSISTOR AND METHOD FOR FABRICATING THE SAME

CROSS-REFERENCE TO RELATED APPLICATION

This application claims priority to and benefits of Chinese Patent Application Serial No. 202010393286.X, filed with the National Intellectual Property Administration of PRC on May 11, 2020, the entire content of which is incorporated herein by reference.

FIELD

The present disclosure relates to the field of semiconductor devices, and more particularly to a transistor and a method for fabricating the same.

BACKGROUND

Low-dimensional semiconductor materials, such as carbon nanotubes, are widely used in transistors as channel materials due to their thin thickness, high mobility, high physical and chemical stability, and high thermal conductivity. As to transistors with low-dimensional semiconductor materials as channel materials, the distribution of carriers in the channel materials may also be changed by doping the low-dimensional semiconductor materials using traditional semiconductor fabricating processes, so as to change electrical properties of the transistors and form p-type and n-type regions respectively, thereby forming semiconductor devices with various structural functions, such as diodes, field effect transistors, etc.

However, due to the particularity of low-dimensional semiconductor materials, there are various problems in doping the channel materials by traditional thermal diffusion and ion implantation. Therefore, the current transistors and their fabrication methods still need to be improved.

SUMMARY

The present disclosure is made based on the inventor's discovery and understanding of the following problems.

As mentioned above, there are various problems in doping channel materials by traditional thermal diffusion and ion implantation. For example, low-dimensional materials are more susceptible to being affected by the environment, so it is difficult to form uniform and reliable doping by thermal diffusion or ion implantation, and it is easy to damage the low-dimensional materials in the doping process. Further, the thickness of the channels formed from the low-dimensional materials is extremely thin, usually equal to the thickness of only one or several monoatomic layers, so it is difficult to achieve effective doping in the channels with impurity ions, which are more likely to be distributed in electrically insulating substrates or be absorbed on the surface of the low-dimensional materials. Moreover, with respect to some low-dimensional materials, such as carbon nanotubes and graphene, having stable chemical properties and very strong chemical bond energy among atoms without dangling bonds on the surface of the low-dimensional materials, it is difficult to bond doped impurity ions with carbon atoms in the low-dimensional materials to form a stable structure, but the doped impurity ions tend to exist in an unstable weak interaction (such as surface adsorption) with the carbon atoms, which leads to an unstable doping effect. Furthermore, annealing usually needs to be performed at a high temperature of above 1000° C. in the traditional doping process to repair lattice damages caused by doping. However, most of the low-dimensional materials cannot withstand such a high temperature, and the high-temperature annealing process also limits the compatibility of the device fabrication process. In addition, because of their ultra-thin channel characteristics and limited carrier concentration as compared with bulk semiconductor materials, it is easier for the low-dimensional semiconductor materials to realize electrostatic control such as gate control and electrostatic doping than the bulk semiconductor materials. Besides, contact characteristics of the low-dimensional semiconductor materials with metal contacts are also different from those of traditional semiconductor materials. For example, there is no obvious Fermi level pinning effect observed in the contact of carbon nanotubes with certain metals as reported. Therefore, traditional doping techniques are not suitable for transistors with low-dimensional semiconductor materials as channel materials.

At present, in order to solve the above problems, there are three ways to fabricate field effect transistors with low-dimensional materials such as carbon nanotubes as channel materials. In the first way, field effect transistors with low-dimensional materials such as carbon nanotubes as channel materials may be fabricated by choosing suitable metal materials as source and drain contact materials. For p-channel metal oxide semiconductor (PMOS) transistors, high work function metals, such as palladium (Pd), may be used as contact materials to realize effective hole injection from metal contacts to the channel in an on state; while for n-channel metal oxide semiconductor (NMOS) transistors, low work function metals, such as scandium (Sc), may be used as contact materials to realize effective electron injection from metal contacts to the channel in an on state. In the second way, carbon nanotube complementary metal oxide semiconductor (CMOS) transistors may be fabricated by utilizing of a bottom gate. In this case, the channel of a bottom gate device may be electrostatically doped by depositing a layer of material with fixed charges on the surface of the channel, so as to adjust the band bending of the channel material, and realize barrier-free injection or tunneling injection of carriers. In the third way, field effect transistors with low-dimensional materials such as carbon nanotubes as channel materials may be fabricated by adopting a top gate structure, i.e. depositing a layer of gate dielectric oxide with fixed charges, on the surface of the channel so as to perform electrostatic doping of the channel, which is similar to the second way.

However, there are still many problems in the low-dimensional material transistors fabricated in the above three ways. As for carbon nanotube transistors with suitable work function metals as contact materials, the most commonly used device structure may be self-aligned with high-K materials as gate dielectrics, but the threshold voltage of such transistors may be hard to adjust. Moreover, when the transistors are in the off state under an operating voltage, reverse tunneling probably happens at the drain contacts due to dramatic bending of the energy band, resulting in the decrease in an on/off ratio and so on. At present, for transistors which are fabricated by adopting a local bottom gate structure in combination with the electrostatic doping of the channel or adopting a top gate structure in combination with electrostatic doping with a gate dielectric oxide, the electrostatic doping is usually realized by using an incompletely coordinated metal oxide (i.e., having many oxygen vacancies or hanging bonds), and thus an unstable interface is generated with many defect and interface states, which may reduce the channel mobility and be detrimental to gate control. At the same time, it is hard for the local bottom gate process to realize the self-alignment fabrication technique, which affects the uniformity of the devices, and decreases the process repeatability.

In conclusion, if an effective doping technique based on the low-dimensional semiconductor materials can be developed, which enables key indicators, such as the current in the on or off state, the threshold voltage, the gate control ability, and the device reliability of the transistors based on the low-dimensional materials to meet requirements at the same time, and enables the process to meet the requirements of large-scale production, the application of the transistors based on the low-dimensional semiconductor materials will be greatly improved.

In view of above, in a first aspect of the present disclosure, a transistor is provided. The transistor includes a substrate, a low-dimensional material layer, a gate, a source, a drain, a gate dielectric layer and spacers. The low-dimensional material layer is provided above the substrate. The source is located at a first side of the gate, and the drain is located at a second side of the gate. The gate dielectric layer is provided between the gate and the low-dimensional material layer. The spacers are provided between the source and the gate and between the drain and the gate, respectively, and have fixed charges.

In the transistor according to embodiments of the present disclosure, the fixed charges in the spacers are used to electrostatically dope a channel in a spacer region, so as to effectively regulate a threshold voltage and on and off states of the transistor without affecting a channel state in a gate region, thereby avoiding the negative impact of whole channel electrostatic doping on the gate control. Further, the spacer doping may also reduce the difference in physical properties of the low-dimensional materials themselves, such as the difference in the diameters of carbon nanotubes, such that the uniformity of electrical properties of the channel materials in the spacer region is improved by electrostatic doping, thereby improving the consistency of the performances of devices in different batches or in the same batch. Besides, by electrostatic doping, the spacers close to the source and the drain may avoid abrupt change in an energy band at the drain side, which can prevent a large number of hot electrons from being generated at the drain terminal in the on state to damage the structure of the transistor and adversely affect the service life of the transistor, and which can reduce a tunneling current at the drain side in the off state. Moreover, the spacer may be formed by a process such as atomic layer deposition that is well compatible with the traditional transistor fabricating process such as etching, thereby reducing the manufacturing cost of the transistor. In addition, the process for forming the fixed charges in the spacers is flexible and controllable, so there are no special restrictions on the materials of the spacers. As a result, different spacer materials, such as inorganic materials with good thermal conductivity or low-K dielectrics, may be chosen to further improve the performance of the transistor.

In some embodiments, a material for the low-dimensional material layer includes at least one selected from carbon nanotubes, silicon nanowires, nanowires of elements of groups II-VI, nanowires of elements of groups III-V, and two-dimensional layered semiconductor materials. Therefore, the performance of the transistor may be further improved.

In some embodiments, a material for the spacers includes at least one of a high-K dielectric and a low-K dielectric, thereby reducing a parasitic capacitance between the source and the gate and between the drain and the gate, so as to further improve the performance of the transistor.

In some embodiments, the material for the spacers includes at least one selected from silicon oxide, silicon nitride, silicon oxynitride, aluminium oxide, hafnium oxide, and molybdenum oxide. Therefore, the performance of the transistor may be further improved.

In some embodiments, a material for the gate dielectric layer includes a high-K dielectric, preferably yttrium oxide. Therefore, the performance of the transistor may be further improved.

In some embodiments, the gate dielectric layer is located at a channel region and separates the low-dimensional material layer from the gate and the spacers. Therefore, when the spacers are deposited, the low-dimensional material layer in a source region, a drain region and a spacer region is protected by the gate dielectric layer.

In some embodiments, a gap exists between the spacer and the gate, thereby further reducing the parasitic capacitance between the source and the gate and between the drain and the gate.

In some embodiments, the low-dimensional material layer is wrapped by the gate, the gate dielectric layer, the source, the drain and the spacers. As a result, a gate-all-around device is fabricated, and a wrap-around source, a wrap-around drain and wrap-around spacers are formed, thereby reducing the interference of the substrate on the low-dimensional material layer. In addition, the low-dimensional material layer is fully wrapped by the spacers, thereby improving the electrostatic doping effects.

In some embodiments, the transistor includes a plurality of the low-dimensional material layers, which are spaced apart from each other by at least the gate, the gate dielectric layer, the source, the drain and the spacers. Therefore, the performance of the transistor may be further improved.

In some embodiments, the transistor further includes a dielectric layer on a surface of the gate away from the gate dielectric layer, and a ratio of a thickness of the dielectric layer to a thickness of the gate is in a range of 1:1 to 20:1. Therefore, the gate is protected by the dielectric layer in a subsequent etching process.

In some embodiments, the dielectric layer includes at least one selected from silicon nitride and silicon oxide, and the gate includes at least one selected from tantalum nitride (TaN), titanium nitride (TiN) and polycrystalline silicon. Therefore, the performance of the transistor may be further improved.

In some embodiments, the thickness of the dielectric layer is in a range of 100 to 2000 nm, and the thickness of the gate is in a range of 5 to 100 nm. Therefore, the performance of the transistor may be further improved.

In some embodiments, an orthographic projection of the gate on the substrate is within an orthographic projection of the dielectric layer on the substrate. Therefore, the performance of the transistor may be further improved.

In some embodiments, a ratio of a distance between the source and the gate or between the drain and the gate to a distance between the source and the drain is in a range of 0.1 to 0.4, and the distance between the source and the drain is in a range of 20 nm to 5 μm. Therefore, the performance of the transistor may be further improved.

In a second aspect of the present disclosure, a method for fabricating the transistor as described hereinbefore is provided. The method includes: forming a low-dimensional material layer, a gate dielectric layer, a source, a drain and a gate above a substrate, in which the gate dielectric layer is located between the low-dimensional material layer and the gate; and forming spacers between the source and the gate and between the drain and the gate, respectively. The spacers have fixed charges. Therefore, the transistor as described above may be obtained easily and conveniently.

In some embodiments, the method includes: sequentially forming the low-dimensional material layer, a gate dielectric material layer and the gate material layer on the substrate; patterning the gate material layer to form the gate and expose a part of the gate dielectric material layer where the gate is not located; forming a spacer material layer on a top and a sidewall of the gate and the exposed part of the gate dielectric material layer by atomic layer deposition (ALD) or chemical vapor deposition (CVD); removing a part of the spacer material layer by dry etching and retaining the spacer material layer at the sidewall of the gate to form the spacers; and removing the gate dielectric material layer at a side of the spacer away from the gate by etching to form the gate dielectric layer, and depositing a metal to form the source and the drain, respectively. Therefore, the structures like the spacers, the source and the drain may be formed by etching, thereby improving the yield of the transistor formed by the method and realizing the large-scale production of the transistor.

In some embodiments, when the gate dielectric material layer is made of yttrium oxide, forming the gate dielectric layer includes removing yttrium oxide by wet etching with an etchant including diluted hydrochloric acid at an etching temperature of 0 to 30° C. When the gate dielectric material layer includes yttrium oxide and a high-K dielectric other than yttrium oxide, forming the gate dielectric layer includes removing yttrium oxide by wet etching and removing the high-K dielectric other than yttrium oxide by dry etching. Therefore, the gate dielectric material layer may be etched easily and conveniently.

In some embodiments, after forming the gate material layer, the method further includes: forming a dielectric material layer at a surface of the gate material layer away from the gate dielectric material layer, and patterning the dielectric material layer to form the dielectric layer when forming the gate. Therefore, the dielectric layer may be formed easily and conveniently.

In some embodiments, the dielectric material layer includes silicon nitride and silicon oxide, and the gate material layer includes tantalum nitride. Forming the dielectric layer and the gate includes: longitudinally etching the dielectric material layer and the gate material layer by reactive ion etching using a longitudinal etching gas, in which the longitudinal etching gas includes trifluoromethane and argon, and a volume percentage of trifluoromethane in the longitudinal etching gas is in a range of 30% to 95%; or longitudinally etching the dielectric material layer by inductively coupled plasma etching, in which a power of a bottom electrode is greater than 10% of a power of a top electrode; laterally etching the gate material layer by reactive ion etching using a lateral etching gas, in which the lateral etching gas includes sulfur hexafluoride and argon, and a volume percentage of sulfur hexafluoride in the lateral etching gas is in a range of 30% to 95%; or laterally etching the gate material layer by inductively coupled plasma etching, in which a power of a bottom electrode is less than 15% of a power of a top electrode. Therefore, it is possible to form a structure in which a width of the dielectric layer is greater than that of the gate.

BRIEF DESCRIPTION OF THE DRAWINGS

These and other aspects and advantages of embodiments of the present disclosure will become apparent and more readily appreciated from the following descriptions made with reference to the drawings, in which:

FIG. 8 is a flow chart of a method for fabricating a transistor according to another embodiment of the present disclosure;

FIG. 9 shows a transfer characteristic curve of a transistor according to inventive example 1 of the present disclosure;

DETAILED DESCRIPTION

Figure 1:
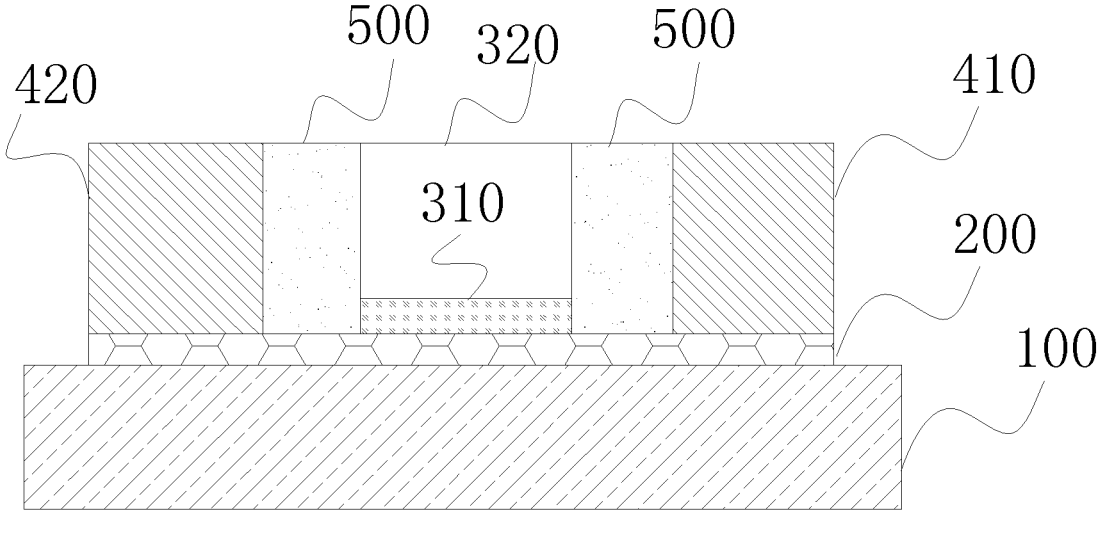
FIG. 1 is a schematic cross-sectional view of a transistor according to an embodiment of the present disclosure.

Embodiments of the present disclosure will be described in detail below, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

In a first aspect of the present disclosure, a transistor is provided. According to embodiments of the present disclosure, with reference to FIG. 1, the transistor includes a substrate 100, a low-dimensional material layer 200, a source 410, a drain 420, a gate 320, a gate dielectric layer 310 and spacers 500. The low-dimensional material layer 200 is provided above the substrate 100 and may be formed from a low-dimensional (one- or two-dimensional) semiconductor material. The source 410 is located at a first side of the gate 320, and the drain 420 is located at a second side of the gate 320. The gate dielectric layer 310 is provided between the gate 320 and the low-dimensional material layer 200. The spacers 500 are provided between the source 410 and the gate 320 and between the drain 420 and the gate 320, respectively, and have fixed charges.

In the transistor, the fixed charges in the spacers are used to electrostatically dope a channel in a spacer region, which is capable of alleviating or even eliminating the negative influence of the traditional doping process on a transistor with a low-dimensional semiconductor material as a channel material.

For the convenience of understanding, a principle of the transistor for achieving the above advantageous effects is briefly explained as follows:

As mentioned above, it is difficult to apply the traditional doping process to transistors with low-dimensional semiconductor materials as channel materials. Moreover, for transistors with suitable work function metals as contact materials which is fabricated by a self-aligned process with high-K materials as gate dielectrics, for example, the parasitic capacitance between the source and the gate and between the drain and the gate is larger, the threshold voltage is hard to adjust, and the tunneling current in the off state is larger. In addition, for a transistor in which a bottom gate structure including a local bottom gate structure is adopted and a layer of material having fixed charges is deposited on a surface of the channel material layer to achieve electrostatic doping, for example, gate control is probably weakened or the threshold voltage is difficult to adjust, contact resistance in the on state, with respect to tunneling injection, is larger, the transconductance is decreased, and a self-alignment process is difficult to perform.

According to embodiments of the present disclosure, since the spacers are located between a source region and a gate region and between a drain region and the gate region, respectively, and sidewalls of the spacers are in contact with sidewalls of the source and the drain, respectively, the transistor has advantageous effects as follows:

First, the fixed charges in the spacers are used to electrostatically dope the low-dimensional material in the spacer region, thereby preventing the electrostatic doping from affecting intrinsic properties of the low-dimensional material in the gate region.

Second, by electrostatically doping the channel materials in the spacer region, the spacers adjacent to the source and the drain may adjust the band bending at the drain side, for example, alleviate excessive band bending at the drain side, and thus it is possible to prevent a large number of hot electrons from being generated at a drain terminal in the on state of the transistor to damage the structure of the transistor, thereby prolonging the service life of the transistor and improve the reliability of the transistor. At the same time, in the off state of the transistor, barrier thinning caused by excessive band bending at the drain side is alleviated, the reverse tunneling of carriers at the drain is inhibited, thereby reducing a leakage current in the off state and the power consumption of the transistor and increasing an on/off ratio of the transistor.

Third, when at least one side of the spacer is in contact with the source, the drain or the gate, the process for forming the spacer, the source, the drain or the gate may be compatible with the self-alignment process. For example, a pre-formed gate may be used as a mask in the depositing process of the spacer, or the spacer is used as a mask to form the gate, the source and the drain by the self-alignment process, thereby greatly reducing the production cost of the transistor with this structure.

Fourth, the electrostatic doping of the spacers may reduce the difference in electrical properties of transistors caused by the difference in physical properties of the low-dimensional materials themselves, such as the difference in the diameters of carbon nanotubes, and improve the consistency of electrical properties of transistors in the on state. At this time, the on-state current distribution of the transistor is determined by both the electrostatic doping strength of the spacers and the diameter distribution of carbon nanotubes. Especially for the low-dimensional material layer formed from low-dimensional semiconductor materials, it is difficult to ensure that the electrical properties of the low-dimensional material layers of devices in different batches or in the same batch are completely consistent, for example, the diameters of the carbon nanotubes are different. Although the state density of the carbon nanotubes themselves is limited, electrostatic doping in the spacer region makes the final on-state contact resistances of the carbon nanotubes with different diameters closer to each other, thereby reducing the difference in the on-state currents caused by the diameter distribution of the carbon nanotubes.

Fifth, the spacers may be formed from a variety of electrically insulating materials, and there are various ways to introduce the fixed charges into the spacers, which does not bring special restrictions on the selection of the spacer materials. Thus, suitable spacer materials and spacer size are selected according to specific needs of the transistor so as to meet the requirements of the electrostatic doping of the channel below the spacers. When an inorganic material with good thermal conductivity is used to form the spacers, it is possible to dissipate heat of the device, thereby improving the thermal stability of the device. When a low-K dielectric is used to form the spacers, the parasitic capacitance between the source and the gate and between the drain and the gate can be reduced.

Sixth, the spacers themselves can isolate the channel from the air, thereby protecting the device from water and oxygen in the air.

Seventh, the spacer material is able to passivate and protect a source/drain contact. For example, when an active work function metal (such as scandium) is used to form the source/drain contact in a carbon nanotube NMOS transistor, as scandium (Sc) is very active, it is easy to react scandium with most metal oxides in the heat treatment process. By selecting a suitable spacer material, such as silicon nitride (SiN), the scandium (Sc) contact can be protected, thereby avoiding an interface reaction between scandium (Sc) and the gate dielectric oxide.

As a result, the electrostatic doping of the channel material can be effectively performed while ensuring that key properties of the transistor meet the practical requirements.

According to embodiments of the present disclosure, a material for the low-dimensional material layer 200 is not particularly restricted, and may include, for example, carbon nanotubes, silicon nanowires, nanowires of elements of groups II-VI, nanowires of elements of groups III-V, and two-dimensional layered semiconductor materials. Specifically, the material for the low-dimensional material layer 200 may include single-walled carbon nanotubes, multi-walled carbon nanotubes, networked carbon nanotubes or carbon nanotube arrays where an extension direction of the carbon nanotube is identical to an extension direction of the channel. Alternatively, two-dimensional layered nano-materials including, but not limited to, black phosphorus, molybdenum disulfide and the like may be used to form the low-dimensional material layer 200. Therefore, the performance of the transistor may be further improved.

As described above, a material for the spacer 500 is not particularly restricted, which may be selected as required. For example, the material for the spacer 500 may include a high-K dielectric, such as aluminium oxide ($Al_2O_3$), hafnium oxide ($HfO_x$, where $1 < x < 2$), aluminium nitride (AlN), molybdenum oxide ($MO_x$, where $1 < x < 3$) and the like; and a low-K dielectric with a dielectric constant less than 5, preferably in a range of 1 to 4, such as silicon oxide, silicon nitride, silicon oxynitride and the like. The low-K dielectric is able to reduce the parasitic capacitance between the source and the gate and between the drain and the gate, thereby further improving the performance of the transistor. According to embodiments of the present disclosure, the material for the spacer includes metal oxides, such as metal oxides containing nitrogen or silicon. A wide variety of types of metal oxides can be selected to form the spacer 500, so as to meet the requirements of the density and distribution of the fixed charges in the spacer 500. Therefore, the material for the spacer 500 may be a combination of different materials, so as to meet the performance requirements of the transistor. For example, the spacer 500 may consist of two spacer sublayers, i.e. a first spacer sublayer and a second spacer sublayer, which are formed from two different electrically insulating materials, respectively. The first spacer sublayer is close to the low-dimensional material layer and has the fixed charges therein, while the second spacer sublayer is located at a surface of the first spacer sublayer away from the low-dimensional material layer and formed from a low-K dielectric, so that the electrostatic doping below the spacer is achieved and the parasitic capacitance between the source and the gate and between the drain and the gate is lowered, thereby further improving the performance of the transistor.

According to specific embodiments of the present disclosure, the material for the spacer 500 may include at least one selected from silicon oxide, silicon nitride, silicon oxynitride, aluminium oxide, hafnium oxide, and molybdenum oxide ($MO_x$, where $1 < x < 3$). Different types of doping may be achieved by selecting different spacer materials, for example, p-type electrostatic doping may be achieved with a spacer formed from molybdenum oxide ($MO_x$, where $1 < x < 3$), while n-type electrostatic doping may be achieved with a spacer formed from silicon nitride or hafnium oxide. The density of fixed charges in the spacer may be adjusted by changing process parameters for depositing the spacer material. For example, hafnium oxide may be grown by atomic layer deposition (ALD), and the composition (i.e. a ratio of hafnium atoms to oxygen atoms) and structure of hafnium oxide may be adjusted by changing the hafnium pulse time and the water pulse time or changing the deposition temperature, so as to adjust the density of fixed charges in hafnium oxide.

According to specific embodiments of the present disclosure, the size of the spacer 500 and the density of the fixed charges contained therein are not particularly restricted, which can be determined based on the specific requirements of the transistor. By adjusting the size of the spacer and the density of the fixed charges contained therein, the electrostatic doping level may be adjusted, so as to adjust the threshold voltage, the on state, the off state, the uniformity and reliability of the transistor. Specifically, the density and distribution of the fixed charges in the spacer as well as the size of the spacer determine its electrostatic doping degree to the low-dimensional material in the spacer region, i.e., the band bending status of the channel in the spacer region. Therefore, by adjusting the spacer material and the fixed charges contained therein, a structure similar to a silicon-based LDD (lightly doped drain) device may be achieved, i.e., the source and drain regions are heavily doped, and the spacer region is lightly doped, so as to adjust the threshold voltage and on-state contact resistance of the transistor and inhibit the off-state tunneling current. In a preferred embodiment, the spacer is formed from an inorganic material, so that the thermal conductivity, thermal stability and reliability of the transistor are improved by taking advantage of the better thermal conductivity and reliability of the inorganic material.

According to embodiments of the present disclosure, a material for the gate dielectric layer 310 is also not particularly restricted, which may be selected as required. For example, the gate dielectric layer 310 may be formed from an electrically insulating material commonly used in the transistor. According to some specific embodiments of the present disclosure, the material for the gate dielectric layer 310 may include a high-K dielectric, preferably yttrium oxide. Therefore, the performance of the transistor may be further improved. The inventors have found that, when using yttrium oxide to form the gate dielectric layer 310, the yttrium oxide layer may also be functioned as an etching stop layer in the etching process, so as to prevent the low-dimensional material layer 200 below the gate dielectric layer 310 from being damaged by the etching process.

Figure 2:
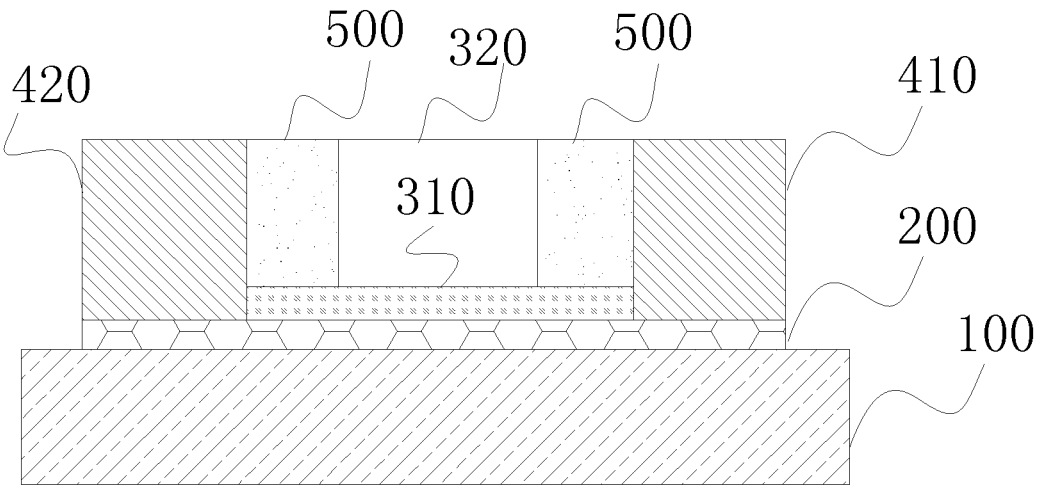
FIG. 2 is a schematic cross-sectional view of a transistor according to another embodiment of the present disclosure.

According to embodiments of the present disclosure, referring to FIG. 2, the gate dielectric layer 310 may be extended to the source and drain regions, i.e., the gate dielectric layer 310 may be located above the channel region between the source side and the drain side, and separate the low-dimensional material layer 200 from the gate and the spacers. Therefore, the low-dimensional material layer in the source and drain regions is protected by the gate dielectric layer when the spacers are deposited. Specifically, the gate dielectric layer 310 may be used as a protective layer to avoid damaging the low-dimensional material layer 200 formed from carbon nanotubes, so that the spacer material may be deposited by thermal atomic layer deposition (ALD), plasma enhanced atomic layer deposition (PEALD), plasma enhanced chemical vapor deposition (PECVD), inductive coupled plasma chemical vapor deposition (ICP-CVD) and the like.

Figure 3:
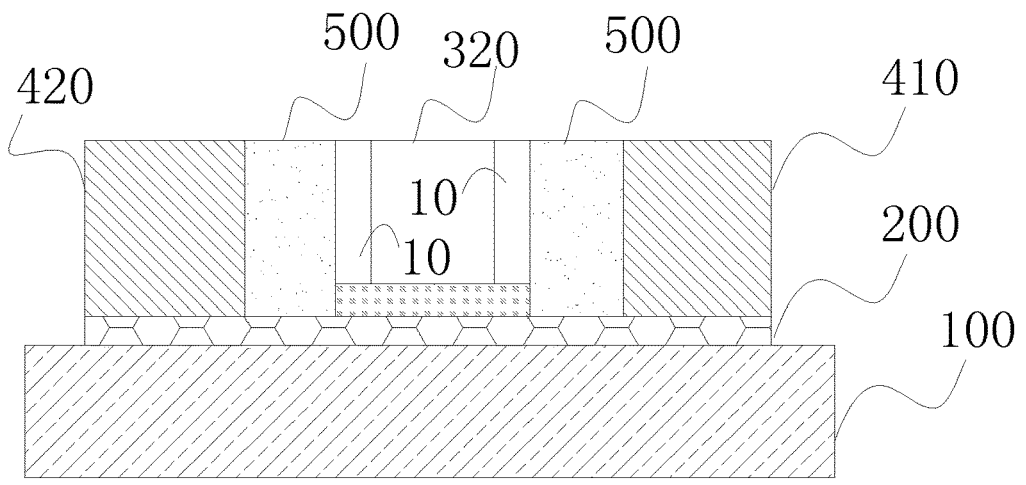
FIG. 3 is a schematic cross-sectional view of a transistor according to yet another embodiment of the present disclosure.

According to some embodiments of the present disclosure, referring to FIG. 3, a gap 10 exists between the spacer 500 and the gate 320. Therefore, the parasitic capacitance between the source 410 and the gate 320 and between the drain 420 and the gate 320 may be further reduced.

Figure 4:
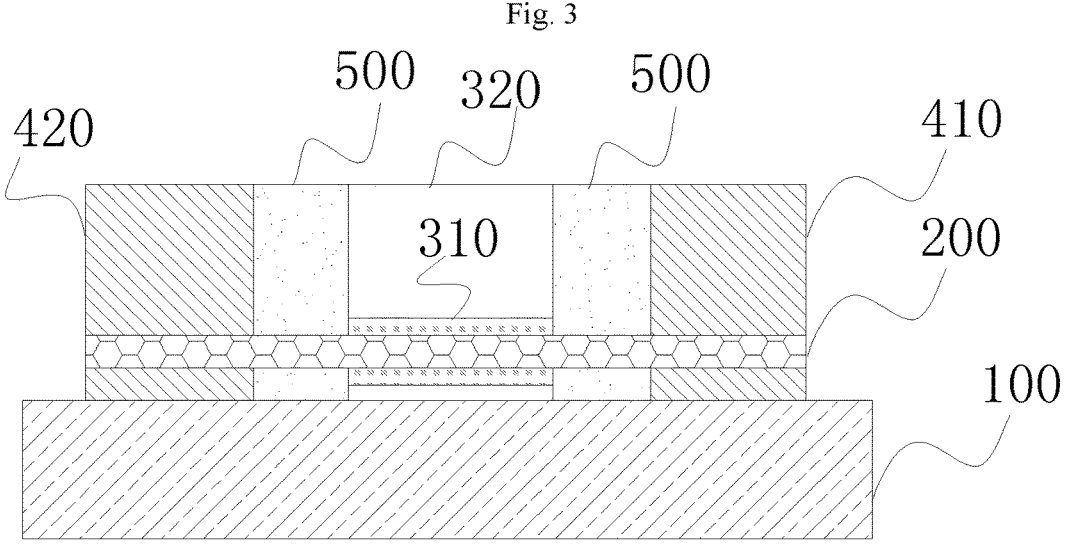
FIG. 4 is a schematic cross-sectional view of a transistor according to yet another embodiment of the present disclosure.
Figure 5:
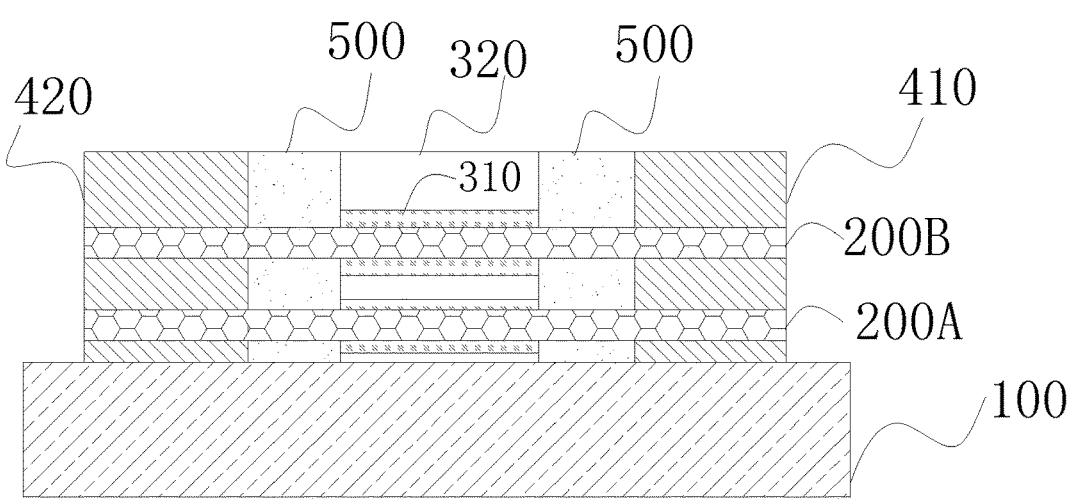
FIG. 5 is a schematic cross-sectional view of a transistor according to yet another embodiment of the present disclosure.

According to embodiments of the present disclosure, referring to FIG. 4 and FIG. 5, the low-dimensional material layer 200 may not be in contact with the substrate 100, but is separated from the substrate 100 by the gate dielectric layer 310, the gate 320, the source 410, the drain 420 and the spacers 500. That is, the low-dimensional material layer 200 is located inside and completely wrapped by the gate 320, the gate dielectric layer 310, the source 410, the drain 420 and the spacers 500. In this way, it is possible to fabricate a gate-all-around device and to form a wrap-around source, a wrap-around drain and wrap-around spacers, thereby reducing the interference of the substrate 100 on the low-dimensional material layer 200. In addition, the low-dimensional material layer 200 may be fully wrapped by the spacers 500, thereby improving the electrostatic doping effects. This kind of device structure is able to reduce the interference of the substrate 100 to the performance of the low-dimensional material layer 200, reduce the performance degradation of the device caused by the scattering of the carriers by the substrate 100, and reduce the influence of the interface of the gate dielectric layer 310 and the substrate 100 on the uniformity and reliability of the device.

According to embodiments of the present disclosure, the transistor may include a plurality of the low-dimensional material layers, for example, layers 200A and 200B as shown in FIG. 5. The plurality of the low-dimensional material layers are spaced apart from each other by at least the gate 320, the gate dielectric layer 310, the source 410, the drain 420 and the spacers 500, and each of the plurality of low-dimensional material layers are fully wrapped by the gate 320, the gate dielectric layer 310, the source 410, the drain 420 and the spacers 500. Therefore, the performance of the transistor may be further improved.

Figures 6, 7:
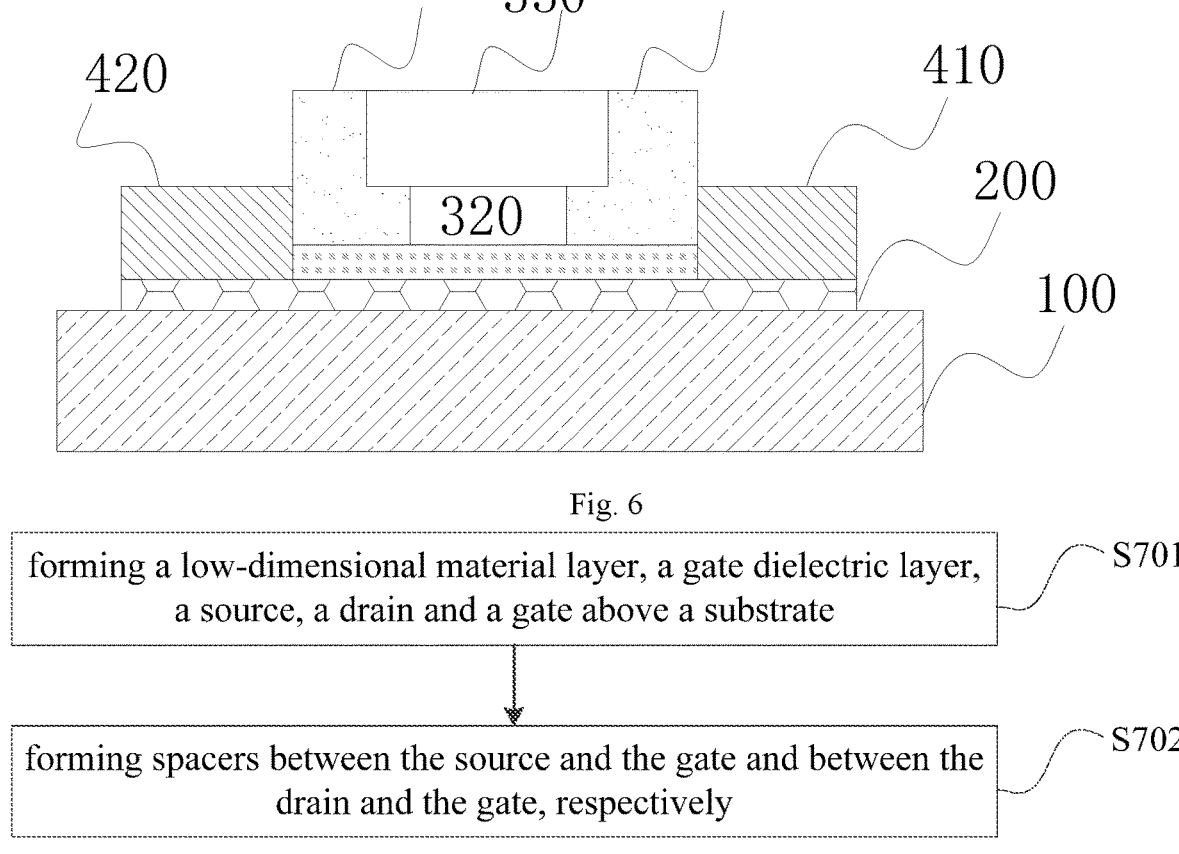
FIG. 6 is a schematic cross-sectional view of a transistor according to yet another embodiment of the present disclosure.
FIG. 7 is a flow chart of a method for fabricating a transistor according to an embodiment of the present disclosure.

According to embodiments of the present disclosure, referring to FIG. 6, the transistor further include a dielectric layer 330 on a surface of the gate 320 away from the gate dielectric layer 310. The dielectric layer 330 may include at least one selected from silicon nitride and silicon oxide. In the etching process for forming the source and the drain, the dielectric layer 330 may prevent the gate dielectric layer 310 and the gate 320 therebelow from being affected by etching and play an electrically insulating effect. According to some specific embodiments of the present disclosure, a ratio of a thickness of the dielectric layer 330 to a thickness of the gate 320 is in a range of 1:1 to 20:1. In some specific examples, the thickness of the dielectric layer 330 may be two or more times as large as the thickness of the gate 320. For example, the thickness of the dielectric layer 330 is in a range of 100 to 2000 nm, and the thickness of the gate 320 is in a range of 5 to 100 nm. A thicker dielectric layer 330 may better play the electrically insulating effect and better protect the gate dielectric layer 310 and the gate 320 therebelow in the etching process. Therefore, the performance of the transistor may be further improved.

According to embodiments of the present disclosure, referring to FIG. 6, a size of the gate 320 may be smaller than that of the dielectric layer 330, i.e., an orthographic projection of the gate 320 on the substrate 100 is within an orthographic projection of the dielectric layer 330 on the substrate 100. Therefore, the dielectric layer 330 above the gate 320 may be used as a self-alignment mask to form the source 410 and the drain 420, thereby further reducing the parasitic capacitance between the gate 320 and the source 410 and between the gate 320 and the drain 420. A material for the gate 320 may include tantalum nitride (TaN), titanium nitride (TiN) and polycrystalline silicon. Therefore, by adjusting the etching parameters, the gate material layer may be laterally etched easily and conveniently, so as to form the gate 320 with a width smaller than that of the dielectric layer 330.

According to embodiments of the present disclosure, a ratio of a distance between the source 410 and the gate 320 or between the drain 420 and the gate 320 (i.e., a size of the spacer region) to a distance between the source 410 and the drain 420 (i.e., a length of the channel) is in a range of 0.1 to 0.4, and the distance between the source 410 and the drain 420 (i.e., a length of the channel) is in a range of 20 nm to 5 μm. Therefore, by adjusting the size of the spacer 500, parameters like the threshold voltage, the contact resistance and the parasitic capacitance of the transistor are regulated to meet the requirements of the comprehensive indicators of the transistor in practical applications.

In a second aspect of the present disclosure, a method for fabricating the transistor as described above is provided. Referring to FIG. 7, the method includes the following steps.

In step S701: a low-dimensional material layer, a gate dielectric layer, a source, a drain and a gate are formed above a substrate.

The respective positions of the low-dimensional material layer, the gate dielectric layer, the source, the drain and the gate are described in detail hereinbefore, which will not be elaborated here.

In step S702: spacers are formed between the source and the gate and between the drain and the gate, respectively.

Specifically, the spacers with fixed charges may be formed by depositing a spacer material after etching a gate material layer for forming the gate. Therefore, the transistor as described above may be fabricated easily and conveniently.

It should be illustrated that the sequence of forming the low-dimensional material layer, the gate dielectric layer, the source, the drain, the gate and the spacers in this method is not particularly restricted, which may be selected according to the specific structure (as shown in FIG. 1 to FIG. 6) and fabrication process of the transistor.

According to some specific embodiments of the present disclosure, the transistor may be formed by an etching process. As compared with a stripping process, the etching process has a better product yield, and can avoid the occurrence of defects such as contamination of the low-dimensional material layer or short circuit of the device caused by incomplete stripping during large-scale production.

According to specific embodiments of the present disclosure, each step of the method based on the etching process will be described in detail below. Specifically, referring to FIG. 8, the method includes the following steps.

In step S801: a low-dimensional material layer, a gate dielectric material layer and a gate material layer are sequentially formed on the substrate.

According to embodiments of the present disclosure, in this step, the low-dimensional material layer, the gate dielectric material layer and the gate material layer may be sequentially formed by a depositing process.

Specifically, the substrate may be an electrically insulating substrate like a $SiO_2/Si$ substrate, a quartz substrate, an $Al_2O_3$ substrate, a glass substrate, a polymer substrate or the like.

The low-dimensional material layer may be a carbon nanotube array film, a networked carbon nanotube film, a layer of nanowires (such as silicon nanowires, nanowires of elements of groups II-VI, or nanowires of elements of groups III-V), a two-dimensional semiconductor material layer or the like. The forming manner of the low-dimensional material layer is not particularly restricted, for example, the low-dimensional material layer may be formed on a surface of the substrate by solution deposition or may be transferred to the surface of the substrate by a transfer technique.

The material for the gate dielectric material layer may be selected correspondingly based on the type of materials in the low-dimensional material layer. When the low-dimensional material layer is a carbon nanotube film, yttrium oxide $(Y_2O_3)$ or a combination of yttrium oxide $(Y_2O_3)$ and a high-K dielectric other than yttrium oxide may be selected to form the gate dielectric material layer, in which the yttrium oxide layer may also be functioned as an etching stop layer to prevent the carbon nanotubes from being damaged by plasma etching. For example, the gate dielectric material layer, e.g., an yttrium oxide layer, may be formed by atomic layer deposition (ALD), chemical vapor deposition (CVD), plasma enhanced chemical vapor deposition (PECVD), physical vapor deposition (PVD), electron beam evaporation deposition or the like. Specifically, the yttrium oxide layer may be formed through plating yttrium by electron beam evaporation and then performing thermal oxidation.

The gate material layer may be formed from a metal material (e.g. TaN, TiN or the like) or a compound material (e.g. polycrystalline silicon). For example, the gate material layer may be formed from tantalum nitride (TaN). The etching process for tantalum nitride (TaN) is relatively mature, and use of tantalum nitride (TaN) to form the gate material layer may improve the yield and reduce the process cost. In the subsequent steps, the gate material layer and the gate dielectric material layer are patterned by etching to form the gate and the gate dielectric layer of the transistor, respectively. The gate material layer, e.g., a tantalum nitride (TaN) layer, may be formed by chemical vapor deposition (CVD), plasma enhanced chemical vapor deposition (PECVD), physical vapor deposition (PVD) or electron beam evaporation deposition or the like. For example, the gate material layer may be formed by depositing a layer of tantalum nitride (TaN) using physical vapor deposition (CVD).

According to other embodiments of the present disclosure, a dielectric material layer is formed above the gate material layer. For example, the dielectric material layer may be formed from silicon oxide (e.g., $SiO_2$) or silicon nitride ($Si_3N_4$), so as to prevent the gate dielectric layer and the gate therebelow from being affected by etching in the subsequent etching process and play an electrically insulating effect. The dielectric material layer may be used as a hard mask in the etching process and as a self-alignment mask in the subsequent formation of the source and the drain. The forming manner of the dielectric material layer, e.g., a silicon oxide or silicon nitride layer, is not particularly restricted. For example, the silicon oxide layer may be formed by plasma enhanced chemical vapor deposition (PECVD).

In step S802: the gate material layer is patterned to form the gate and expose a part of the gate dielectric material layer.

According to embodiments of the present disclosure, in this step, the gate material layer is patterned to form the gate and expose a part of the gate dielectric material layer where the gate is not located. Specifically, an etching mask may be provided above the gate material layer, and a part of the gate material layer outside a gate region is removed.

According to some specific embodiments of the present disclosure, when the dielectric material layer is provided above the gate material layer, a mask formed from a photoresist may be provided above the dielectric material layer, a part of the dielectric material layer not covered by the mask is removed by etching to form a dielectric layer, and then the dielectric layer is used as a hard mask, so that a part of the gate material layer outside the gate region is removed by etching to form the gate.

As mentioned above, when yttrium oxide ($Y_2O_3$) is used to form the gate dielectric material layer, the gate dielectric material layer may be used as an etching stop layer, so as to prevent the low-dimensional material layer from being damaged by etching when forming the gate.

In step S803: a spacer material layer is formed on a top and a sidewall of the gate and the exposed part of the gate dielectric material layer.

According to embodiments of the present disclosure, in this step, the spacer material layer may be formed on the top and sidewall of the gate and the exposed part of the gate dielectric material layer by atomic layer deposition (ALD) or chemical vapor deposition (CVD). Since the gate material layer in a source region and a drain region is removed in the previous step, the spacer material layer deposited in this step may cover the top and sidewalls of the gate (or the dielectric layer) and a surface of the exposed part of the gate dielectric material layer at the source and drain regions. Therefore, the spacers may be formed in contact with the sidewalls of the gate. Afterwards, spacers with their sidewalls being respectively joined with the source and the drain may be obtained by forming the source and the drain at sides of the spacers away from the gate, respectively. In addition, the specific materials of the spacers and the fixed charges contained therein are described in detail above, which will not be elaborated here.

Specifically, P-type electrostatic doping or N-type electrostatic doping of the low-dimensional material in the spacer region may be realized by choosing different types of spacer materials.

In step S804: a part of the spacer material layer is removed by dry etching and the spacer material layer at the sidewalls of the gate is retained to form the spacers.

According to embodiments of the present disclosure, in this step, a part of the spacer material layer is removed by dry etching and a remaining part of the spacer material layer at the sidewalls of the gate is retained to form the spacers. For example, a part of the spacer material layer which covers the regions for forming the source and the drain, and/or a part of the spacer material layer located at a top of the dielectric layer may be removed. The specific process parameters of dry etching are not particularly restricted, which may be controlled according to specific types of the spacer materials.

In step S805: the gate dielectric material layer at a side of the spacer away from the gate is removed by etching to form the gate dielectric layer, and the source and the drain are formed, respectively.

According to embodiments of the present disclosure, in this step, a part of the gate dielectric material layer which covers the regions for forming the source and the drain may be removed, and operations for forming the source and the drain are performed. Specifically, a metal material layer for the source and the drain may be deposited, and then a part of the metal material layer outside the source and drain regions is removed by etching, so as to form the source and the drain, respectively. Therefore, the spacers, the source, the drain and the like may be formed based on the etching process, which improves the yield of the transistor and realizes the large-scale production of the transistor. Specifically, when the gate dielectric material layer is formed from yttrium oxide ($Y_2O_3$), the gate dielectric layer may be formed by removing yttrium oxide ($Y_2O_3$) by wet etching with an etchant at an etching temperature of 0 to 30° C. The etchant includes diluted hydrochloric acid. Specifically, the etchant may be an aqueous solution formed by diluting 37% concentrated hydrochloric acid with water in a ratio of hydrochloric acid to water ranging from 1:20 to 1:100. When the gate dielectric material layer includes yttrium oxide and a high-K dielectric other than yttrium oxide, the high-K dielectric other than yttrium oxide may be removed by dry etching, and yttrium oxide may be removed by the wet etching as descried above. In this way, the gate dielectric layer is formed.

According to embodiments of the present disclosure, the transistor as shown in FIG. 6 may be fabricated by adjusting the specific parameters of the etching process. According to specific embodiments of the present disclosure, the dielectric material layer may be formed from silicon nitride or silicon oxide, and the gate material layer may be formed from tantalum nitride. The dielectric layer and the gate may be formed by reactive ion etching or inductively coupled plasma etching. Specifically, the etching parameters are adjusted to perform longitudinal etching on the dielectric material layer and the gate material layer, and then the etching parameters are readjusted to perform lateral etching on the gate material layer. As a result, a lateral width of the gate thus formed is less than that of the dielectric layer.

Specifically, the dielectric material layer and the gate material layer may be longitudinally etched by reactive ion etching using a longitudinal etching gas, in which the longitudinal etching gas includes trifluoromethane and argon, and a volume percentage of trifluoromethane in the longitudinal etching gas is in a range of 30% to 95%. Alternatively, the dielectric material layer is longitudinally etched by inductively coupled plasma etching, in which a power of a bottom electrode is greater than 10% of a power of a top electrode.

Subsequently, the lateral etching is performed. Specifically, the gate material layer may be laterally etched by reactive ion etching using a lateral etching gas, in which the lateral etching gas includes sulfur hexafluoride and argon, and a volume percentage of sulfur hexafluoride in the lateral etching gas is in a range of 30% to 95%. Alternatively, the gate material layer is laterally etched by inductively coupled plasma etching, in which a power of a bottom electrode is less than 15% of a power of a top electrode. Therefore, a structure in which a width of the dielectric layer is greater than that of the gate may be formed.

In the specification of the present disclosure, the terms "upper", "lower", etc. should be construed to refer to the orientation or positional relationship as then described or as shown in the drawings under discussion. These relative terms are for convenience of description and do not require that the present disclosure be constructed or operated in a particular orientation.

In the specification of the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Inventive Example 1

Fabrication of Carbon Nanotube NMOS Transistor

In this example, the low-dimensional material layer 200 is formed from a single-walled semiconductor carbon nanotube material, the source 410 and the drain 420 are formed from scandium (Sc) with a low work function, the gate dielectric layer 310 is formed from yttrium oxide ($Y_2O_3$), the gate 320 is formed from tantalum nitride (TaN), and the spacers 500 are formed from aluminium oxide ($Al_2O_3$) and contain fixed positive charges so as to electrostatically dope the channel in the spacer region with electrons and adjust the band bending in the spacer region, thereby effectively adjusting the threshold voltage and on and off states of the transistor, especially inhibiting the reverse tunneling at the drain side in the off state and reducing the off-state current. The obtained transistor is shown in FIG. 1. The spacer material is in direct contact with the carbon nanotubes, and the depositing manner of the spacer material is thermal atomic layer deposition, thereby preventing the plasma deposition process from damaging the carbon nanotubes. Characteristic parameters of the carbon nanotube transistor are as follows: the gate 320 has a length of about 4 μm, the channel has a width of about 20 μm, the gate dielectric layer 310 has a thickness of about 20 nm, the spacers 500 have a width of about 200 nm, and the substrate in contact with the channel is a thermally oxidized silicon dioxide layer with a thickness of about 300 nm, with a heavily doped silicon layer below the silicon dioxide layer. Transfer characteristics of the transistor are measured, and its transfer characteristic curve is shown in FIG. 9.

Inventive Example 2

Fabrication of Carbon Nanotube NMOS Transistor

Figure 10:
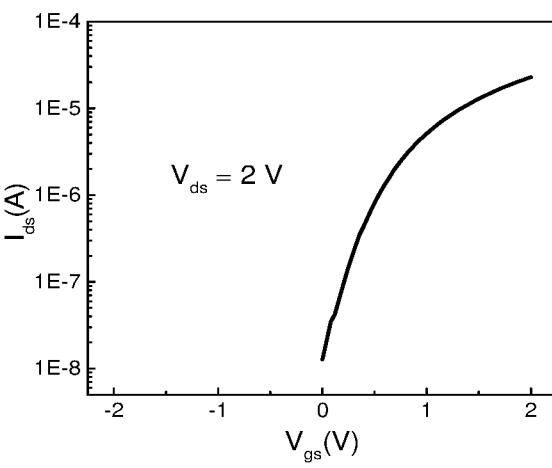
FIG. 10 shows a transfer characteristic curve of a transistor according to inventive example 2 of the present disclosure.

In this example, the low-dimensional material layer 200 is formed from a single-walled semiconductor carbon nanotube material, the source 410 and the drain 420 are formed from scandium (Sc) with a low work function, the gate dielectric layer 310 is formed from yttrium oxide ($Y_2O_3$), the gate 320 is formed from tantalum nitride (TaN), and the spacers 500 are formed from hafnium oxide ($HfO_x$, where $1 < x < 2$) and contain fixed positive charges. The obtained transistor is shown in FIG. 2, in which the gate dielectric layer 310 separates the spacers 500 from the layer of carbon nanotubes. Characteristic parameters of the carbon nanotube transistor are as follows: the gate 320 has a length L of about 4 μm, the channel has a width W of about 30 μm, the gate dielectric layer 310 has a thickness of about 20 nm, the spacers 500 have a width of about 150 nm, and the substrate in contact with the channel is a thermally oxidized silicon dioxide layer with a thickness of about 300 nm, with a heavily doped silicon layer below the silicon dioxide layer. The transfer characteristic curve of the transistor is shown in FIG. 10.

Inventive Example 3

Fabrication of Carbon Nanotube NMOS Transistor

In this example, the low-dimensional material layer 200 is formed from a single-walled semiconductor carbon nanotube material, the source 410 and the drain 420 are formed from scandium (Sc) with a low work function, the gate dielectric layer 310 is formed from yttrium oxide ($Y_2O_3$), the gate 320 is formed from tantalum nitride (TaN), and the spacers 500 are formed from hafnium oxide (HfOx, where $1 < x < 2$), and contain fixed positive charges so as to electrostatically dope the channel in the spacer region with electrons and adjust the band bending in the spacer region, thereby effectively adjusting the threshold voltage and on and off states of the transistor, especially inhibiting the reverse tunneling at the drain side in the off state and reducing the off-state current. The obtained transistor is shown in FIG. 6, in which the dielectric layer 330 is provided above the gate 320. During the formation of the gate 320, the gate material layer is laterally etched with the dielectric layer 330 as a mask, and then the spacer material is deposited by atomic layer deposition (ALD), with the spacer material being filled in a groove formed by the lateral etching of the gate material layer. Afterwards, a part of the spacer material is removed by reactive ion etching with the dielectric layer as a hard mask, obtaining the spacer as shown in FIG. 6.

Figure 11:
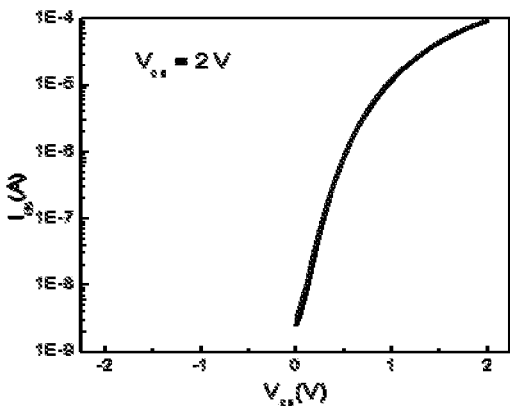
FIG. 11 shows a transfer characteristic curve of a transistor according to inventive example 3 of the present disclosure.

Characteristic parameters of the carbon nanotube transistor are as follows: the gate 320 has a length of about 4 μm, the channel has a width of about 20 μm, the gate dielectric layer 310 has a thickness of about 20 nm, the spacers 500 have a width (i.e., a distance between the source and the gate or between the drain and the gate) of about 250 nm, and the substrate in contact with the channel is a thermally oxidized silicon dioxide layer with a thickness of about 300 nm, with a heavily doped silicon layer below the silicon dioxide layer. The transfer characteristic curve of this transistor is shown in FIG. 11.

Comparative Example 1

Figure 12:
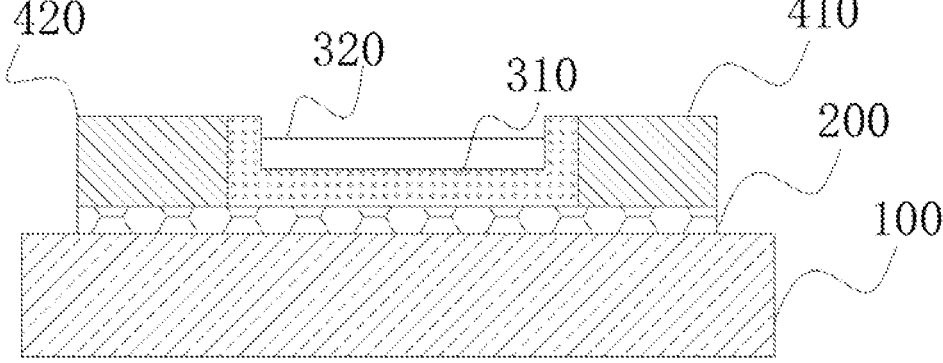
FIG. 12 is a schematic cross-sectional view of a transistor according to comparative example 1.
Figure 13:
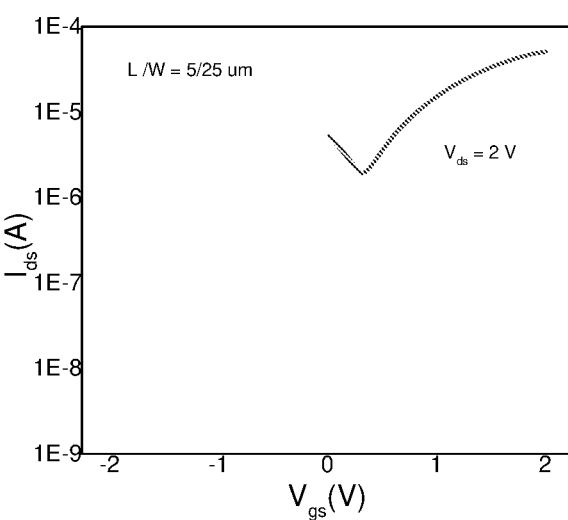
FIG. 13 shows a transfer characteristic curve of a transistor according to comparative example 1.

The source 410 and the drain 420 are formed from scandium (Sc), the gate dielectric layer 310 is formed from hafnium oxide ($HfO_2$), the gate 320 is formed from palladium (Pd), the channel is formed from single-walled semiconductor carbon nanotubes, and the transistor thus obtained is shown in FIG. 12. Characteristic parameters of the transistor are as follows: the gate 320 has a length L of 5 μm and a thickness of 15 nm, the channel has a width W of about 25 μm, the gate dielectric layer 310 has a thickness of 18 nm, and the source 410 and the drain 420 each have a thickness of 80 nm. The transfer characteristic curve of this transistor is shown in FIG. 13.

Comparative Example 2

Figure 14:
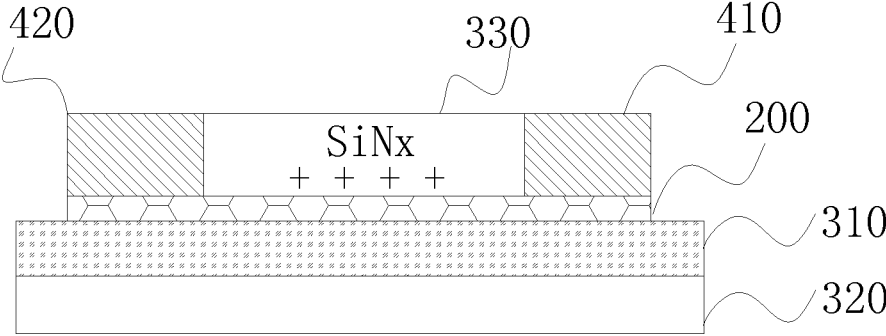
FIG. 14 is a schematic cross-sectional view of a transistor according to comparative example 2.
Figure 15:
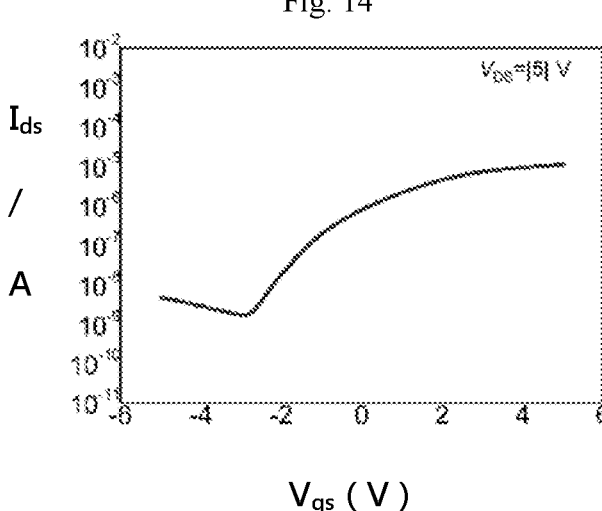
FIG. 15 shows a transfer characteristic curve of a transistor according to comparative example 2.

In this carbon nanotube NMOS transistor, the source 410 and the drain 420 are formed from palladium (Pd), and the bottom gate includes a gate dielectric layer 310 formed from silicon dioxide, and a gate 320 formed from heavily doped silicon. Characteristic parameters of this transistor are as follows: the gate 320 has a length of 4 μm, and the channel has a width of 50 μm. The transistor is shown in FIG. 14, and its transfer characteristic curve is shown in FIG. 15.

Comparative Example 3

Figure 16:
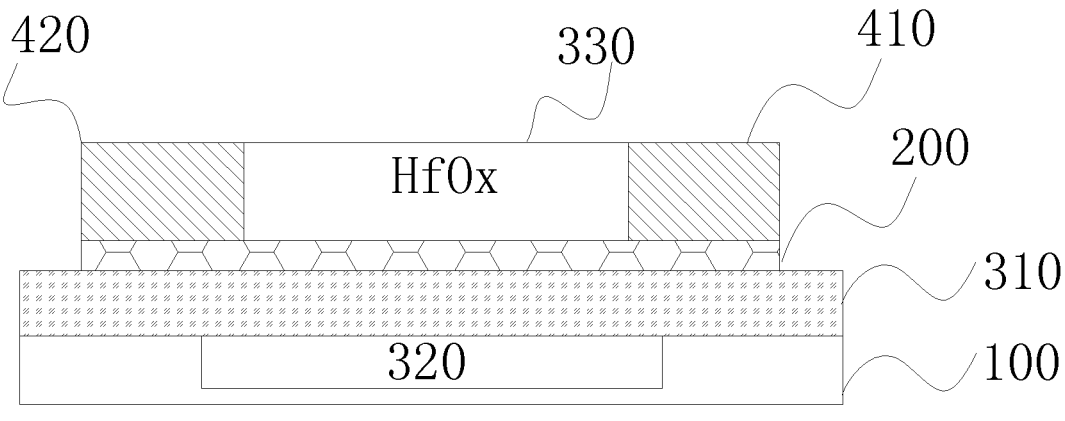
FIG. 16 is a schematic cross-sectional view of a transistor according to comparative example 3.
Figure 17:
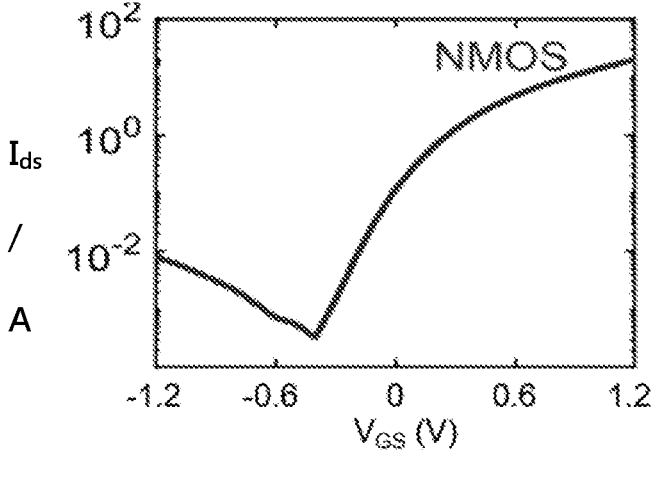
FIG. 17 shows a transfer characteristic curve of a transistor according to comparative example 3.

In this carbon nanotube NMOS transistor, the source 410 and the drain 420 are formed from titanium (Ti), and the local bottom gate includes a gate 320 formed from platinum (Pt), and a gate dielectric layer 310 which is a stack of an aluminium oxide layer and a hafnium oxide layer. Characteristic parameters of this transistor are as follows: the gate 320 has a length of about 1.5 μm, and the channel has a width of about 19 μm. The transistor is shown in FIG. 16, and its transfer characteristic curve is shown in FIG. 17.

As can be seen from comparison between Inventive Examples 1-3 and Comparative Examples 1-3, the carbon nanotube transistors in Inventive Examples 1-3 have a significantly reduced off-state current, a higher on/off ratio and a more suitable threshold voltage as compared with the carbon nanotube transistor in Comparative Example 1 produced by a self-aligned fabrication process with high-K materials as gate dielectrics. Further, the carbon nanotube transistor in Inventive Example 1 exhibits a better gate control, a more suitable threshold voltage or a higher on/off ratio, i.e. has superior comprehensive indicators and thus can better meet the requirements of practical applications, as compared with the bottom-gate carbon nanotube transistor in Comparative Example 2 or the local bottom-gate carbon nanotube transistor in Comparative Example 3.

Specifically, in Comparative Examples 2-3, when the transistor is in an on state, carriers are injected into the channel from the source by tunneling with a low injection efficiency, and the source/drain contact resistance is larger. In contrast, in Inventive Example 1, when the transistor is in an on state, carriers are injected from the source into the channel without barrier, and the contact resistance is smaller.

Further, in Comparative Examples 2-3, when the transistor is in an off state, as the channel in the gate region is also electrostatically doped by the materials overlaid above the channel, it is difficult to turn off the transistor under zero gate bias, resulting in higher electrostatic power consumption. In addition, the electrostatic doping of the channel in the gate region by the materials overlaid above the channel also brings an adverse effect on the gate control, causes Coulomb scattering during the transportation of carriers, and reduces the transconductance of the transistor. Moreover, it is difficult for the bottom-gate or local bottom-gate device to accomplish the self-aligned fabrication process, which is not conducive to large-scale integration. Furthermore, the parasitic capacitance between the source and the gate and between the drain and the gate is larger. In contrast, in Inventive Example 1, the electrostatic doping effect of the spacers will not affect the gate control of the gate region, so that the transistor exhibits better gate control characteristics.

Besides, the performance of transistors in Inventive Examples 2 and 3 is also significantly superior to that in Comparative Examples 1-3. In particular, as compared with the carbon nanotube transistor in Inventive example 2, the carbon nanotube transistor in Inventive Example 3 has a smaller parasitic capacitance between the source and the gate and between the drain and the gate, a better electrical insulation effect exhibits between the source and the gate and between the drain and the gate, and the device yield is higher, which is more conducive to large-scale production.

Reference throughout this specification to "an embodiment", "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples. Although explanatory embodiments have been shown and described, it would be appreciated by those skilled in the art that changes, alternatives, and modifications may be made in the embodiments without departing from spirit and principles of the disclosure. In addition, it should be noted that terms such as "first" and "second" are used herein for purposes of description and are not intended to indicate or imply relative importance or significance.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

The invention claimed is:

1. A method for fabricating a transistor, comprising:

forming a low-dimensional material layer, a gate dielectric layer, a source, a drain, and a gate above a substrate, wherein the gate dielectric layer is located between the low-dimensional material layer and the gate; and forming spacers between the source and the gate and between the drain and the gate, respectively, wherein the spacers have fixed charges, wherein the gate, the gate dielectric layer, and the spacers are formed by:

sequentially forming the low-dimensional material layer, a gate dielectric material layer, and a gate material layer on the substrate;

patterning the gate material layer to form the gate and expose a part of the gate dielectric material layer where the gate is not located;

forming a spacer material layer on a top and a sidewall of the gate and the exposed part of the gate dielectric material layer by atomic layer deposition or chemical vapor deposition;

removing a part of the spacer material layer by dry etching and retaining the spacer material at the sidewall of the gate to form the spacers; and removing the gate dielectric material layer at a side of each of the spacers away from the gate by etching to form the gate dielectric layer.

2. The method according to claim 1, further comprising: depositing a metal to form the source and the drain, respectively.

3. The method according to claim 1, wherein:

when the gate dielectric material layer is made of yttrium oxide, forming the gate dielectric layer comprises removing yttrium oxide by wet etching with an etchant comprising diluted hydrochloric acid at an etching temperature of 0 to 30° C.; and when the gate dielectric material layer comprises yttrium oxide and a high-K dielectric other than yttrium oxide, forming the gate dielectric layer comprises removing the high-K dielectric other than yttrium oxide by dry etching and removing yttrium oxide by wet etching.

4. The method according to claim 1, wherein after forming the gate material layer, the method further comprises:

forming a second dielectric material layer at a surface of the gate material layer away from the gate dielectric material layer, and patterning the second dielectric material layer to form a second dielectric layer when forming the gate.

5. The method according to claim 4, wherein the second dielectric material layer comprises silicon oxide and silicon nitride, and the gate material layer comprises tantalum nitride, and forming the second dielectric layer and the gate comprises:

longitudinally etching the second dielectric material layer and the gate material layer by reactive ion etching using a longitudinal etching gas, wherein the longitudinal etching gas comprises trifluoromethane and argon, and a volume percentage of trifluoromethane in the longitudinal etching gas is in a range of 30% to 95%; or longitudinally etching the second dielectric material layer by inductively coupled plasma etching, wherein a power of a bottom electrode is greater than 10% of a power of a top electrode; and laterally etching the gate material layer by reactive ion etching using a lateral etching gas, wherein the lateral etching gas comprises sulfur hexafluoride and argon, and a volume percentage of sulfur hexafluoride in the lateral etching gas is in a range of 30% to 95%; or laterally etching the gate material layer by inductively coupled plasma etching, wherein a power of a bottom electrode is less than 15% of a power of a top electrode.

6. The method according to claim 1, wherein a material for the low-dimensional material layer comprises at least one selected from carbon nanotubes, silicon nanowires, nanowires of elements of groups II-VI, nanowires of elements of groups III-V, and two-dimensional layered semiconductor materials.

7. The method according to claim 1, wherein:

a material for the spacers comprises at least one of a high-K dielectric and a low-K dielectric, comprising at least one selected from silicon oxide, silicon nitride, silicon oxynitride, aluminum oxide, hafnium oxide, and molybdenum oxide; and/or a material for the gate dielectric layer comprises a high-K dielectric, comprising yttrium oxide.

8. The method according to claim 1, wherein the gate dielectric layer is located at a channel region and separates the low-dimensional material layer from the gate and the spacers.

9. The method according to claim 1, wherein a gap exists between each of the spacers and the gate.

10. The method according to claim 1, wherein the low-dimensional material layer is wrapped by the gate, the gate dielectric layer, the source, the drain and the spacers.

11. The method according to claim 1, wherein the transistor comprises a plurality of low-dimensional material layers, which are spaced apart from each other by at least the gate, the gate dielectric layer, the source, the drain and the spacers.

12. The method according to claim 1, wherein the transistor further comprises:

a second dielectric layer on a surface of the gate away from the gate dielectric layer, wherein:

a ratio of a thickness of the second dielectric layer to a thickness of the gate is in a range of 1:1 to 20:1;

the second dielectric layer comprises at least one selected from silicon nitride and silicon oxide; and/or the gate comprises at least one selected from TaN, TiN and polycrystalline silicon.

13. The method according to claim 12, wherein the thickness of the second dielectric layer is in a range of 100 to 2000 nm, and the thickness of the gate is in a range of 5 to 100 nm.

14. The method according to claim 12, wherein:

an orthographic projection of the gate on the substrate is within an orthographic projection of the second dielectric layer on the substrate;

a ratio of a distance between the source and the gate or between the drain and the gate to a distance between the source and the drain is in a range of 0.1 to 0.4; and/or the distance between the source and the drain is in a range of 20 nm to 5 μm.

* * * * *